United States Patent
Gailhard et al.

(10) Patent No.: US 9,460,808 B2
(45) Date of Patent: Oct. 4, 2016

(54) METHOD AND DEVICE FOR CONTROLLING A SAMPLE AND HOLD CIRCUIT

(71) Applicant: STMicroelectronics (Rousset) SAS, Rousset (FR)

(72) Inventors: Bruno Gailhard, Rognes (FR); Yohan Joly, Le tholonet (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/549,291

(22) Filed: Nov. 20, 2014

(65) Prior Publication Data

US 2015/0155053 A1 Jun. 4, 2015

(30) Foreign Application Priority Data

Dec. 3, 2013 (FR) .................................... 13 62000

(51) Int. Cl.
| | |
|---|---|
| *H03K 5/00* | (2006.01) |
| *G11C 27/02* | (2006.01) |
| *G11C 29/50* | (2006.01) |
| *G11C 29/02* | (2006.01) |
| *H03K 3/0231* | (2006.01) |

(52) U.S. Cl.
CPC ............ *G11C 27/024* (2013.01); *G11C 29/023* (2013.01); *G11C 29/028* (2013.01); *G11C 29/50016* (2013.01); *H03K 3/0231* (2013.01)

(58) Field of Classification Search
None
See application file for complete search history.

(56) References Cited

U.S. PATENT DOCUMENTS

| | | | |
|---|---|---|---|
| 5,761,143 A | 6/1998 | Fukuda | |
| 5,818,268 A | 10/1998 | Kim et al. | |
| 6,882,172 B1 | 4/2005 | Suzuki et al. | |
| 7,746,119 B2 * | 6/2010 | Wang ................... | G11C 27/026 327/93 |
| 7,816,951 B1 * | 10/2010 | Lee ...................... | G11C 27/024 327/94 |
| 2005/0248755 A1 | 11/2005 | Chou et al. | |
| 2005/0248976 A1 | 11/2005 | Huang et al. | |
| 2006/0012391 A1 | 1/2006 | Huang | |
| 2006/0250152 A1 | 11/2006 | Rius Vazquez et al. | |
| 2007/0145981 A1 | 6/2007 | Tomita et al. | |
| 2009/0309621 A1 | 12/2009 | Hammerschmidt | |
| 2013/0222163 A1 * | 8/2013 | Darthenay .......... | H03M 1/1245 341/122 |
| 2015/0145564 A1 * | 5/2015 | Gailhard ............... | H03K 3/012 327/109 |

FOREIGN PATENT DOCUMENTS

| | | |
|---|---|---|
| DE | 19610555 A1 | 7/1997 |
| DE | 19727262 A1 | 6/1998 |

* cited by examiner

*Primary Examiner* — Long Nguyen
(74) *Attorney, Agent, or Firm* — Slater Matsil, LLP

(57) ABSTRACT

A method is provided for controlling a sample and hold circuit that includes a switching module coupled to a storage capacitor. A circuit external to the sample and hold circuit of generates at least one main current representative of at least one leakage current of the switching module in its off state. The at least one main current is delivered to at least one auxiliary capacitor. An initial pulse signal is generated from the charging and discharging of the at least one auxiliary capacitor. The sampling phase of the sample and hold circuit is triggered at the rate of the pulses of a pulse signal derived from the initial pulse signal.

28 Claims, 12 Drawing Sheets

METHOD AND DEVICE FOR CONTROLLING A SAMPLE AND HOLD CIRCUIT

This application claims the benefit of French Application No. 1362000, filed on Dec. 3, 2013, which application is hereby incorporated herein by reference.

TECHNICAL FIELD

The present application applies to circuits and, in particular embodiments, to a method and device for controlling a sample and hold circuit.

BACKGROUND

In the case of a sample/hold application, a switch receives a voltage at its input, and during a sampling time delivers this voltage to a capacitor connected to its output terminal. During the hold period, the switch is open (that is to say off), and, because of leakage currents, the capacitor may depending on the case either be discharged to earth or charged to the supply voltage.

SUMMARY

Embodiments of the invention relate to the control of electronic switching devices, particularly but not exclusively for sample/hold applications, in particular for taking account of off-state leaks of these switching devices.

The invention applies advantageously but not limitingly to very low-consumption systems, such as very low-consumption microcontrollers which use voltage references that need to be as stable as possible. Such voltage references may be generated by sampling/holding of an input voltage on a capacitor in order to reduce the average consumption.

The invention also applies to the characterization of leaks of junctions and transistors produced by a given fabricating method.

According to one embodiment, it is proposed to control a sample and hold circuit while taking account of its off-state leaks for any temperature of the sample and hold circuit.

According to one embodiment, it is proposed to control a sample and hold circuit with a periodic pulse signal, the period of which is associated with the variation in voltage across the terminals of the storage capacitor, whatever the variations of fabrication methods and supply voltage, which makes it possible to adjust this period as a function of a desired maximum variation in this voltage so that the period is long at ambient temperature, which makes it possible to obtain very low consumption at this ambient temperature.

According to another embodiment, it is proposed to characterize a fabrication method in terms of leaks, that is to say characterize the leaks of junctions and MOS transistors produced by this fabrication method and to do so very accurately and regardless of the temperature.

One aspect provides a method for controlling a sample and hold circuit comprising a switching module connected to a storage capacitor. The method comprises: a) generation by a circuit external to the sample and hold circuit of at least one main current representative of at least one leakage current of the switching module in its off state, b) delivery of the at least one main current to at least one auxiliary capacitor, c) generation of an initial pulse signal from the charging and discharging of the at least one auxiliary capacitor, and d) triggering of the sampling phase of the sample and hold circuit at the rate of the pulses of a pulse signal derived from the initial pulse signal.

Thus, according to one embodiment, the external circuit provides an "image" of the switching module in its off state and the pulses of the initial pulse signal are obtained from successive charges of the auxiliary capacitor or capacitors with one or more currents which are "image" currents of the leakage currents of the switching modules in the off state.

The pulse signal, on the basis of which the sample and hold circuit is controlled, may be the initial pulse signal itself, or alternatively it may be obtained for example by frequency division of the initial pulse signal.

Control of the sample and hold circuit with such a pulse signal takes into account de facto these leaks, and consequently in particular their evolution as a function of temperature.

Thus, it is particularly advantageous for the separation between both pulses to be adjusted in order to satisfy an operating characteristic of the sample and hold circuit, for example a desired maximum limit of the variation in voltage across the terminals of the storage capacitor during the off state of the switching module.

This adjustment may be carried out by altering certain parameters of the external circuit, for example the numbers and sizes of junctions, current mirror coefficients, the size of the auxiliary capacitor or capacitors, or alternatively the division of the frequency of the initial pulse signal.

The initial pulse signal advantageously comprises periodic pulses, the period of which is related to the variation in voltage across the terminals of the storage capacitor during the off state of the switching module.

Furthermore, if the value of the period is adjusted to the ambient temperature, this period will decrease with an increase in the temperature because the period of the clock signal thus generated is exponentially proportional to the temperature, in the same way as the leakage currents.

The switching module may contain a single MOS transistor (NMOS or PMOS), or alternatively two complementary MOS transistors.

Likewise, the external circuit may comprise one or two auxiliary capacitors.

Thus, according to one embodiment, in which the switching module comprises at least one MOS transistor, step a) comprises generation by the external circuit of at least one initial current representative of at least one leakage current of the MOS transistor in its off state, the at least one main current being obtained from the at least one initial current.

According to one embodiment, in step c) the at least one auxiliary capacitor is charged until the voltage across its terminals reaches a threshold, the reaching of this threshold generating a first edge, for example a leading edge, of a pulse of the initial pulse signal, this first edge triggering discharge of the at least one auxiliary capacitor, this discharge generating a second edge of the pulse in the direction opposite to that of the first edge, for example a trailing edge.

When the switching module comprises an NMOS transistor and a PMOS transistor which are connected to the storage capacitor, it is possible according to one variant that
    step a) comprises generation by the external circuit of a first initial current representative of at least one leakage current of the PMOS transistor, the first initial current forming a first main current, and generation of a second initial current representative of at least one leakage current of the NMOS transistor, the second initial current forming a second main current, step b) comprises delivery of the first main current to a first auxiliary capacitor and delivery of the second main current to a second auxiliary capacitor, and step c) comprises charging of the first auxiliary capacitor and charging of the second auxiliary capacitor until a threshold is reached by the first of the two voltages respectively across the terminals of the two auxiliary capacitors, the reaching of this threshold generating a first edge of a pulse of the initial pulse signal, this first edge triggering discharge of the first auxiliary capacitor and of the second auxiliary capacitor, this discharge generating a second edge of the pulse in the direction opposite to that of the first edge.

Again when the switching module comprises an NMOS transistor and a PMOS transistor which are connected to the storage capacitor, it is possible according to another variant that step a) comprises generation by the external circuit of a first initial current representative of at least one leakage current of the PMOS transistor, generation of a second initial current representative of at least one leakage current of the NMOS transistor, generation of a first final current which is equal to the difference between the first initial current and the second initial current if this difference is positive, or to zero if the difference is negative, generation of a second final current which is equal to the difference between the second initial current and the first initial current if this difference is positive, or to zero if the difference is negative, and summation of the two final currents so as to generate a single main current, step b) comprises delivery of this single main current to a single auxiliary capacitor, and step c) comprises charging of the single auxiliary capacitor until the voltage across its terminals reaches a threshold, the reaching of this threshold generating a first edge of a pulse of the initial pulse signal, this first edge triggering discharge of the single auxiliary capacitor, this discharge generating a second edge of the pulse in the direction opposite to that of the first edge.

So as to avoid obtaining a zero current difference, it is also possible according to another variant, when the switching module comprising an NMOS transistor and a PMOS transistor which are connected to the storage capacitor, that step a) comprises generation by the external circuit of a first initial current representative of at least one leakage current of the at least one PMOS transistor, generation of a second initial current representative of at least one leakage current of the at least one NMOS transistor, generation of a first final current which is equal to the difference between the first initial current and the product of the second initial current multiplied by a coefficient less than one if this difference is positive, or to zero if the difference is negative, generation of a second final current which is equal to the difference between the second initial current and the product of the first initial current multiplied by the coefficient if this difference is positive, or to zero if the difference is negative, and summation of the two final currents so as to generate a single nonzero positive current, step b) comprises delivery of this single main current to a single auxiliary capacitor, and step c) comprises charging of the single auxiliary capacitor until the voltage across its terminals reaches a threshold, the reaching of this threshold generating a first edge of a pulse of the initial pulse signal, this first edge triggering discharge of the single auxiliary capacitor, this discharge generating a second edge of the pulse in the direction opposite to that of the first edge.

Another aspect provides a device for controlling a sample and hold circuit, comprising a switching module connected to a storage capacitor, the device comprising a circuit which is external to the sample and hold circuit and comprises at least one auxiliary capacitor, a first circuit, which is configured in order to generate at least one main current representative of at least one leakage current of the switching module in its off state and to deliver the at least one main current to the at least one auxiliary capacitor, a second circuit, which is configured in order to generate an initial pulse signal from the charging and discharging of the at least one auxiliary capacitor, and a control circuit, which is configured in order to trigger the sampling phase of the sample and hold circuit at the rate of the pulses of a pulse signal derived from the initial pulse signal, the separation between both pulses of the pulse signal advantageously being adjusted to meet an operating feature of the sample and hold circuit.

According to one embodiment, in which the switching module comprises at least one MOS transistor, the first circuit comprises at least one initial stage, which is associated with the at least one MOS transistor and is configured in order to generate at least one initial current representative of at least one leakage current of the at least one MOS transistor in its off state, the at least one main current being obtained from the at least one initial current.

According to one embodiment, the second circuit comprises a first block, which is connected to the at least one auxiliary capacitor and is configured in order to generate a first edge of a pulse of the initial pulse signal when the voltage across the terminals of the at least one auxiliary capacitor reaches a threshold, and a second block, which is connected to the output of the first block and is configured in order to discharge the at least one auxiliary capacitor in response to the first edge, the first block then generating a second edge of the pulse in the direction opposite to that of the first edge.

According to one embodiment, in which the switching module comprises an NMOS transistor and a PMOS transistor which are connected to the storage capacitor, the external circuit comprises a first auxiliary capacitor and a second auxiliary capacitor. The first circuit comprises a first initial stage, which is associated with the PMOS transistor and is configured in order to generate a first initial current representative of at least one leakage current of the PMOS transistor, the first initial current forming a first main current, and to deliver it to the first auxiliary capacitor, and a second initial stage, which is associated with the NMOS transistor and is configured in order to generate a second initial current representative of at least one leakage current of the NMOS transistor, the second initial current forming a second main current, and to deliver it to the second auxiliary capacitor. The second circuit comprises a first block, which is connected to the first and second auxiliary capacitors and is configured in order to generate a first edge of a pulse of the initial pulse signal when a threshold is reached by the first of the two voltages respectively across the terminals of the two auxiliary capacitors, and a second block, which is connected to the output of the first block and is configured in order to discharge the two auxiliary capacitors in response to the first edge of the pulse, the first block being configured in order to generate a second edge of the pulse in the direction opposite to that of the first edge in response to the discharge.

According to one embodiment, in which the switching module comprises an NMOS transistor and a PMOS transistor which are connected to the storage capacitor, the external circuit comprises a single auxiliary capacitor. The first circuit comprises a first initial stage, which is associated with the PMOS transistor and is configured in order to generate a first initial current representative of at least one leakage current of the PMOS transistor, a second initial stage, which is associated with the NMOS transistor and is configured in order to generate a second initial current representative of at least one leakage current of the NMOS transistor, a first final stage, configured in order to generate at its output a first final current which is equal to the difference between the first initial current and the second initial current if this difference is positive, or to zero if the difference is negative, and a second final stage, configured in order to generate at its output a second final current which is equal to the difference between the second initial current and the first initial current if this difference is positive, or to zero if the difference is negative. The outputs of the two final stages being connected together to a terminal of the single auxiliary capacitor, so as to allow it to be charged with a main current which is equal to the sum of the two final currents. The second circuit comprises a first block, which is connected to the single auxiliary capacitor and is configured in order to generate a first edge of a pulse of the initial pulse signal when the voltage across the terminals of the single auxiliary capacitor reaches a threshold, and a second block, which is connected to the output of the first block and is configured in order to discharge this single auxiliary capacitor in response to the first edge of the pulse, the first block being configured in order to generate a second edge of the pulse in the direction opposite to that of the first edge in response to the discharge.

According to another embodiment, in which the switching module comprises an NMOS transistor and a PMOS transistor which are connected to the storage capacitor, the external circuit comprises a single auxiliary capacitor. The first circuit comprises a first initial stage, associated with the PMOS transistor and configured in order to generate a first initial current representative of at least one leakage current of the PMOS transistor, a second initial stage, associated with the NMOS transistor and configured in order to generate a second initial current representative of at least one leakage current of the NMOS transistor, a first final stage, configured in order to generate at its output a first final current which is equal to the difference between the first initial current and the product of the second initial current multiplied by a coefficient less than one (for example between 0.5 and 1) if this difference is positive, or to zero if the difference is negative, and a second final stage, configured in order to generate at its output a second final current which is equal to the difference between the second initial current and the product of the first initial current multiplied by the coefficient if this difference is positive, or to zero if the difference is negative. The outputs of the two final stages being connected together to a terminal of the single auxiliary capacitor, so as to allow it to be charged with a main positive, nonzero current which is equal to the sum of the two final currents. The second circuit comprises a first block, which is connected to the single auxiliary capacitor and is configured in order to generate a first edge of a pulse of the initial pulse signal when the voltage across the terminals of the single auxiliary capacitor reaches a threshold, and a second block, which is connected to the output of the first block and is configured in order to discharge this single auxiliary capacitor in response to the first edge of the pulse, the first block being configured in order to generate a second edge of the pulse in the direction opposite to that of the first edge in response to the discharge.

According to one embodiment, the initial stage associated with an MOS transistor comprises at least one component connected in series between a supply terminal and the output of the initial stage, the supply terminal being intended to receive a supply voltage identical to a gate voltage of the MOS transistor in its off state, the at least one component being configured in order to deliver a base current representative of at least one leakage type of the MOS transistor, the corresponding initial current being obtained from the base current.

The base current generated by the component may be very weak. It is also preferable for at least one of the initial stages to comprise current mirror with a mirror coefficient greater than 1, which are connected between the at least one component and the output of the initial stage and configured in order to deliver the corresponding initial current.

The nature of the component varies depending on the types of leaks which are intended to be taken into account.

Thus, the at least one component may comprise at least one reverse-biased PN junction, or at least one auxiliary MOS transistor of the same channel type as the MOS transistor of the switching module, having at least one of its two conduction electrodes connected to the output of the corresponding initial stage (the other conduction electrode may also be connected to the output of the corresponding initial stage, or it may be left floating) and having its gate connected to the supply terminal. Alternatively, the at least one component may comprise at least one auxiliary MOS transistor of the same channel type as the MOS transistor of the switching module, having a first conduction electrode connected to the supply terminal, and a second conduction electrode connected to the output of the corresponding initial stage, and configured in order to be in an off state.

In the case in which the initial stage is associated with an NMOS transistor, it may furthermore comprise at least one additional NMOS transistor, the gate of which is connected to the storage capacitor, the at least one additional NMOS transistor being connected in series with the at least one component.

This makes it possible to have a leakage current of the NMOS which is stable with respect to the supply voltage.

The at least one auxiliary capacitor is advantageously of the same type as the storage capacitor. This thus makes it possible also to take the variations of the method of fabricating the capacitor into account.

Another aspect also provides an integrated circuit comprising at least one sample and hold circuit and at least one control device as defined above.

Such an external circuit may also be used in order to characterize a fabrication method in terms of leakage current.

Thus, another aspect provides a method for characterization of leaks in a method of fabricating MOS transistors, comprising generation by a circuit external to the MOS transistors of at least one current representative of at least one leakage current of at least one MOS transistor in the off state, delivery of the at least one current to at least one auxiliary capacitor, generation of a pulse signal from the charging and discharging of the at least one auxiliary capacitor, and analysis of the separation between the pulses, this separation being commensurately less when the leaks are greater.

Another aspect provides a device for characterization of leaks in a method of fabricating MOS transistors. The device comprises a circuit which is external to the MOS transistors. The circuit comprises at least and auxiliary capacitor and a number of circuits. A first circuit is configured to generate at least one current representative of at least one leakage current of at least one MOS transistor in its off state and to deliver the at least one current to the at least one auxiliary capacitor. A second circuit is configured to generate a pulse signal from the charging and discharging of the at least one auxiliary capacitor. Analysis circuit is configured to analyze the separation between the pulses, this separation being commensurately less when the leaks are greater.

The external circuit is, for example, the same as that defined above in the device for controlling a sample and hold circuit.

BRIEF DESCRIPTION OF THE DRAWINGS

Other advantages and characteristics of the invention will become apparent on studying the detailed description of entirely nonlimiting embodiments and the appended drawings, in which.

DETAILED DESCRIPTION OF ILLUSTRATIVE EMBODIMENTS

Figure 1:
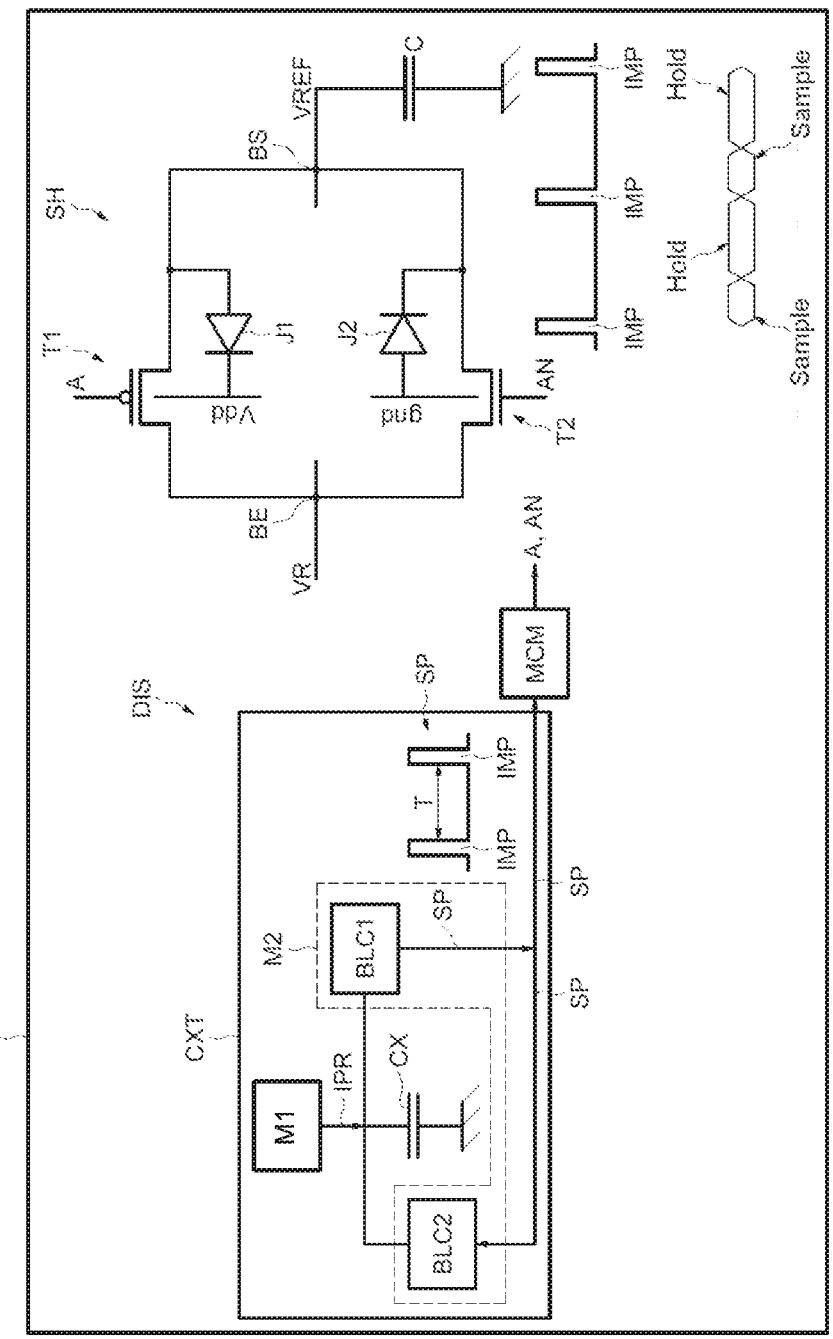
FIGS. 1 to 19 relate to various embodiments of the invention.

In FIG. 1, the reference CI denotes an integrated circuit incorporating a sample and hold circuit SH comprising a switching module which, in this example, has a PMOS transistor T1 and an NMOS transistor T2. These two MOS transistors are connected in parallel, between an input terminal BE and an output terminal BS. A storage capacitor C is connected to the output terminal BS.

As is conventional in the field, the input terminal BE receives an input voltage VR, and the transistors T1 and T2 are controlled by two complementary control signals A and AN so that they are both on or both off. During a sampling period, the switching module is in an on state so as to sample the input voltage VR on the storage capacitor C. At the end of this sampling period, the switching module is placed in an off state, and is then in an off or holding phase during which the voltage $V_{REF}$ across the terminals of the storage capacitor C is supposed to be stable.

Because of the leakage currents of the switching module in the off state, however, the storage capacitor C may depending on the case either be discharged to earth or charged to the supply voltage, which therefore creates an instability in the voltage $V_{REF}$.

These leaks may be of various types. For instance, there may be a gate leakage current between the gate and the transistor conduction electrode connected to the output terminal, or a leakage current between the two conduction electrodes of the transistor, that is to say between the drain and the source, or alternatively a leakage current between the body of the transistor and the conduction electrode which is connected to the output terminal through the corresponding junction, referenced J1 and J2 in FIG. 1.

Except for certain types of gate leaks, these different leaks vary exponentially as a function of the temperature of the integrated circuit. Thus, they are greater at high temperature, for example 125° C., than at ambient temperature (typically 25° C.). Furthermore, depending on the technological variations of the fabrication method, the leaks of N-type junctions may be greater or less than the leaks of P-type junctions. Furthermore, in the case of a stable reference, whatever the supply voltage Vdd, the leaks to the supply voltage Vdd are proportional to this supply voltage Vdd whereas the leaks to earth are not proportional to the supply voltage Vdd.

Thus, provision is made for the integrated circuit to furthermore incorporate a device DIS comprising a circuit CXT external to the sample and hold circuit SH, which will make it possible to form a pulse signal SP intended to control the sample and hold circuit, on the basis of elements which generate currents representative of the leaks of the switching module of the sample and hold circuit SH in its off state.

More precisely, the external circuit CXT comprises at least one auxiliary capacitor CX. A first circuit M1 is configured to generate at least one main current IPR representative of at least one leakage current of the switching module in its off state and to deliver the at least one main current to the at least one auxiliary capacitor CX. A second circuit M2 is configured to generate the pulse signal SP from the charging and discharging of the at least one auxiliary capacitor CX.

This pulse signal SP comprises periodic pulses IMP, the period T of which is linked with the variation $\Delta V_{REF}$ in voltage across the terminals of the storage capacitor during the off state of the switching module.

Consequently, it is entirely possible to adjust this period, for example by altering certain parameters of the external circuit (these will be returned to in more detail below) taking into account a maximum desired variation in voltage across the terminals of the storage capacitor during the off or holding period.

Furthermore, if this adjustment is carried out at ambient temperature, for example during tests in the laboratory or by simulation, the period of the clock signal will de facto decrease when there is an increase in temperature, since the pulse signal is generated from currents of the circuit CXT which are images of the leakage currents of the switching block of the sample and hold circuit SH.

The fabrication method variations are also taken into account.

The device DIS furthermore comprises control circuit MCM, which deliver the control signals A and AN and which are configured in order to trigger the sampling phase of the sample and hold circuit at the rate of the pulses of the pulse signal.

Next, at the end of this sampling phase, the sample and hold circuit SH is placed in an off or holding phase until occurrence of the next pulse IMP.

Before returning in more detail to the second circuit M2, which comprise two blocks BLC1 and BLC2, embodiments of the first circuit M1 will be described in more detail with reference now more particularly to FIGS. 2 to 10.

In fact, it is entirely possible to generate, using the first circuit M1, a current representative of a certain type of leak, or several types of leaks, of the switching block.

Figure 2:
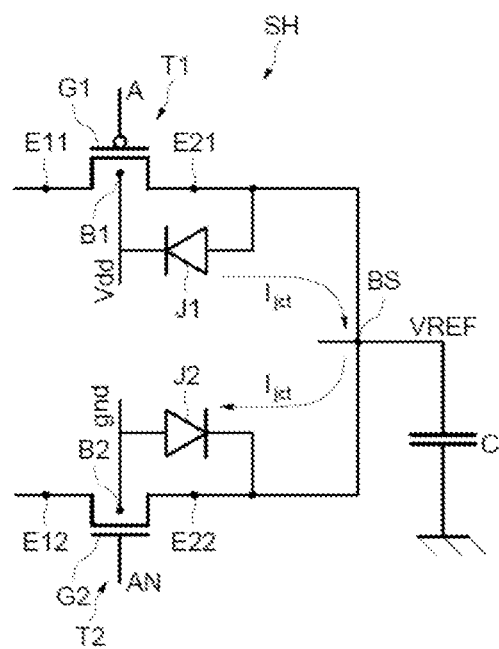

Thus, as illustrated in FIG. 2, a first leakage current is the current $I_{jct}$, which is the current flowing between the bodies B1, B2 of the transistors T1 and T2 and the conduction electrodes E21, E22 connected to the output terminal BS. This current $I_{jct}$ is the current which passes through the junction J1 (J2) in reverse (FIG. 2).

Figure 3:
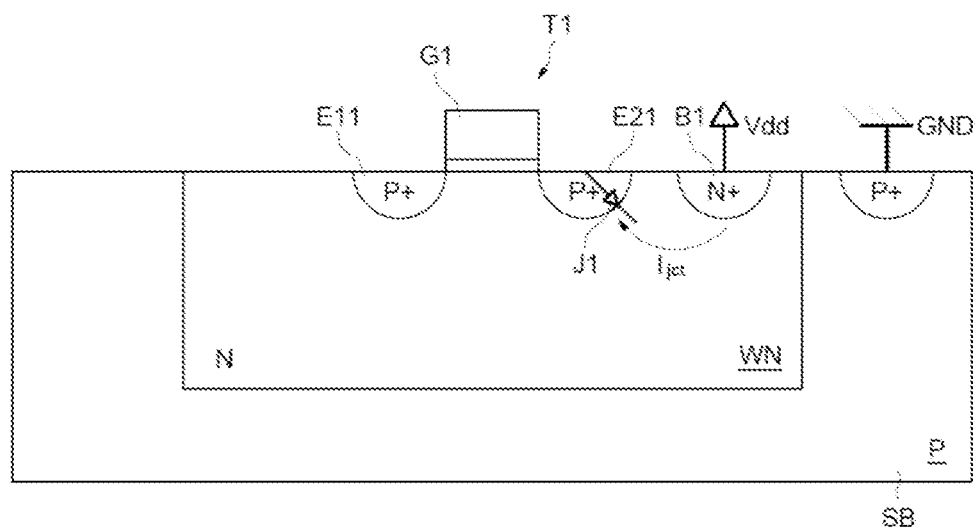
Figure 4:
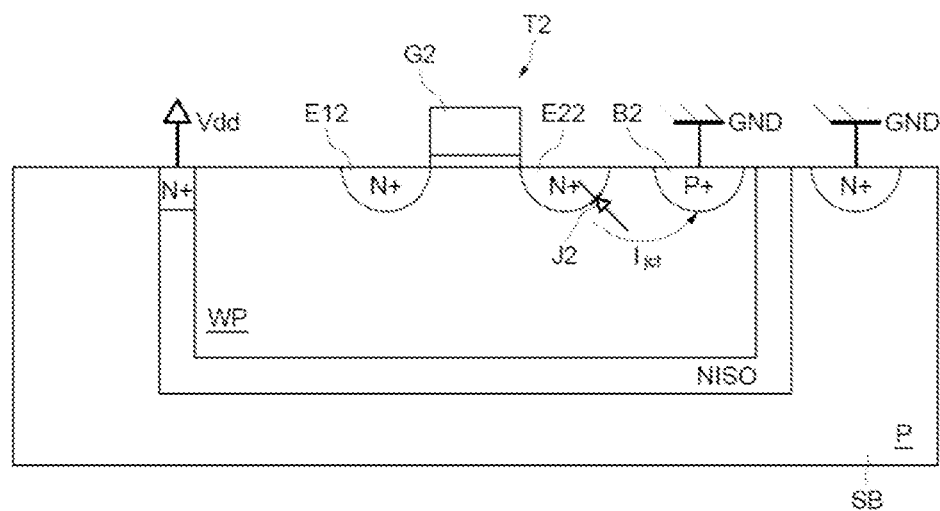

As can be seen in the FIG. 3, when the PMOS transistor T1 is produced in a bulk substrate technology, the body of the transistor T1 is a semiconductor body WN with its substrate contact B1 doped N⁺, and the PN junction J1 is the junction between the P⁺ region of the conduction electrode E21 and the semiconductor body WN.

As regards the NMOS transistor T2 (FIG. 4), the body of this transistor is in bulk substrate technology, the body WP with its substrate contact B2 doped P⁺. This body WP is insulated from the underlying substrate SB by a layer NISO biased to Vdd. The PN junction J2 is the junction between the N⁺ region of the conduction electrode E22 and the body WP.

The bodies B1 and B2 of the transistors T1 and T2 are here respectively biased to the supply voltage Vdd and to earth gnd.

Figure 5:
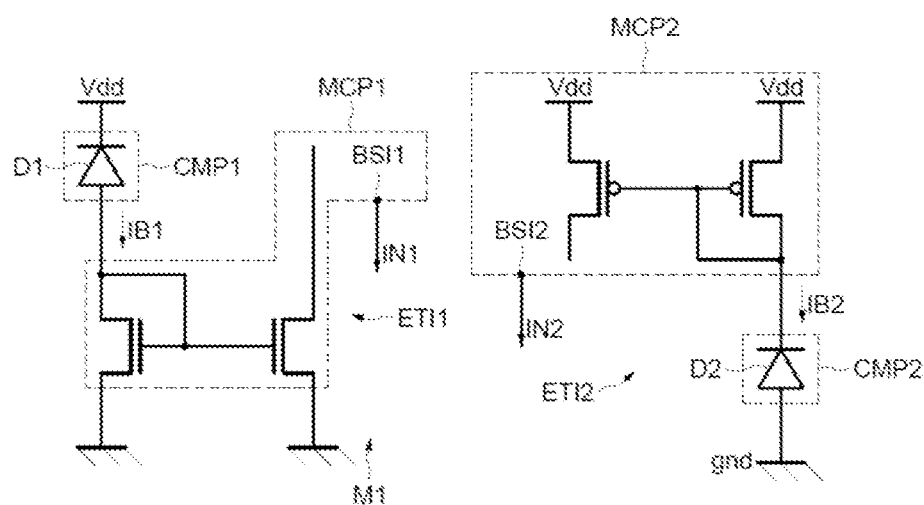

As illustrated in FIG. 5, the first circuit M1 comprises a first initial stage ETI1, associated with the PMOS transistor and configured in order to generate at its output terminal BSI1 a first initial current Ni representative of the leakage current $I_{jct}$ of the PMOS transistor.

The first circuit M1 furthermore comprises a second initial stage ETI2, associated with the NMOS transistor P2 and configured in order to generate a second initial current IN2 on its output terminal BSI2, this second initial current in turn being representative of the leakage current $I_{jct}$ of the NMOS transistor.

Furthermore, the initial stage associated with an MOS transistor, in the case in point the stage ETI1 and the stage ETI2, comprises at least one component CMP1, CMP2, connected in series between a supply terminal (Vdd for the component CMP1 and earth gnd for the component CMP2) and the output of the corresponding initial stage BSI1, BSI2. The supply terminal is intended to receive a supply voltage identical to a gate voltage of the MOS transistor in its off state. This is the reason why this supply voltage is equal to Vdd for the stage ETI1 associated with the PMOS transistor and to earth gnd for the stage ETI2 associated with the NMOS transistor.

Furthermore, the component CMP1, CMP2 is configured in order to deliver a base current IB1, IB2 representative of the intended leak type of the MOS transistor, the initial current IN1, IN2 being obtained from the base current IB1, IB2.

In the example illustrated in FIG. 5, since only the leak of the junction J1, J2 is addressed, the component used is a reverse-biased PN junction. More precisely, the component CMP1 comprises a junction (diode D1) whose cathode is connected to the supply voltage Vdd, whereas the component CMP2 comprises a junction (diode D2) whose anode is connected to earth gnd.

In general, in order to generate currents which are the most accurate possible images of the leaks of the sample and hold circuit, the size (surface area and perimeter) of the component CMP1 or CMP2 is preferably proportional to the size (surface area and perimeter) of the corresponding transistor T1 or T2.

In general, the base currents IB1 and IB2 are very weak. Also, it is preferable for at least one of the initial stages, in the case in point the two initial stages ETI1 and ETI2, to comprise a current mirror MCP1, MCP2 with a mirror coefficient greater than 1, which are connected between the component CMP1 and the output of the initial stage ETI1 so as to deliver the initial current IN1 with a strength higher than that of the base current IB1.

In the example described here, of course, the initial stage may comprise a single component or a plurality of identical components connected in parallel, depending on the desired surface area and size.

Figure 6:
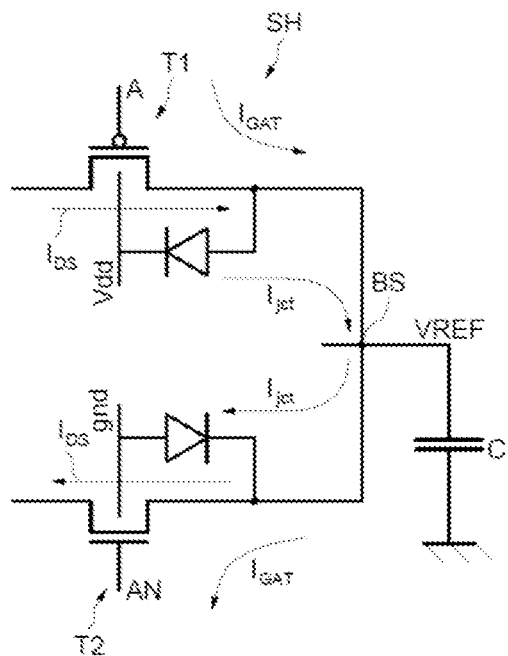

FIG. 6 represents three possible leakage currents of the transistors T1 and T2, namely the gate leakage current $I_{GAT}$, the drain leakage current $I_{DS}$ and the junction leakage current $I_{jct}$.

Figure 7:
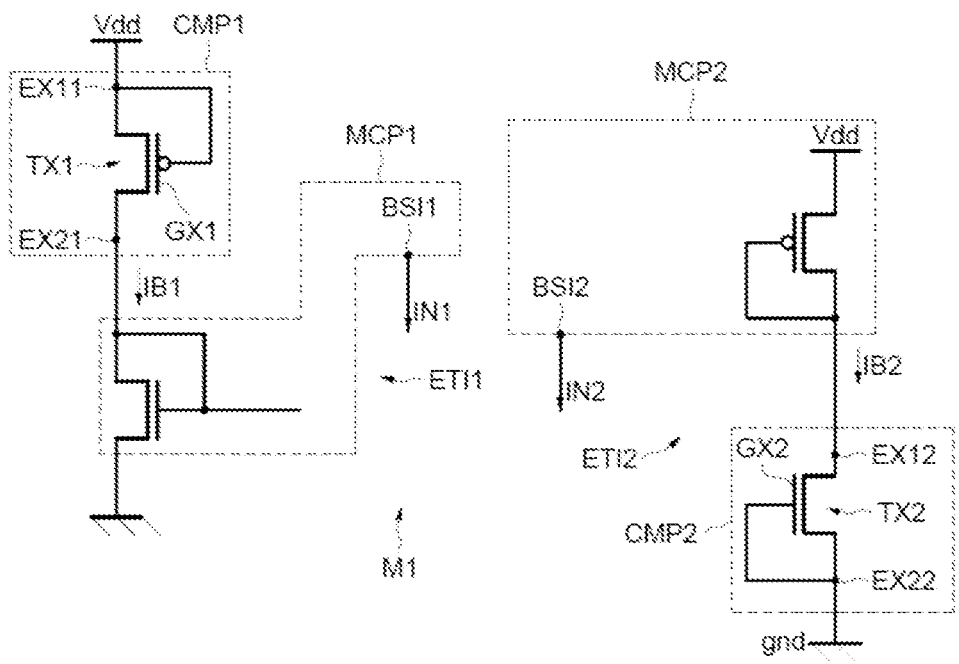

In this case, as illustrated in FIG. 7, the component CMP1 making it possible to deliver the base signal representative of these three leakage currents comprises at least one auxiliary transistor TX1, the conduction electrode EX11 of which is connected to the supply voltage Vdd, as is its gate GX1. Its conduction electrode E21 is connected to the output BSI1 of the stage ETI1 using the current mirror MCP1.

The PMOS transistor TX1 is therefore in its off state.

The component CMP2 comprises at least one auxiliary NMOS transistor TX2, of which the gate GX2 and the conduction electrode EX22 are connected to earth gnd, and of which the conduction electrode E12 is connected to the output BSI2 of the initial stage ETI2 using the current mirror MCP2. Here again, the transistor TX2 is in an off state.

The size of the transistor TX1 and of the transistor TX2 is preferably proportional to the size (surface area and perimeter) of the transistors T1 and T2. The component CMP1 may in this regard comprise a plurality of transistors TX1 connected in parallel. Likewise, the component CMP2 may comprise a plurality of transistors TX2 connected in parallel.

Figure 8:
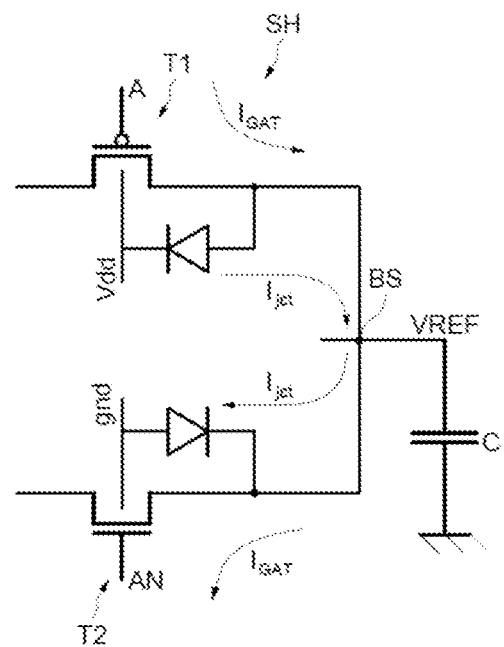

FIG. 8 represents the case in which the switching module of the sample and hold circuit SH has a greatly reduced, or even zero, drain/source leakage current. This is, for example, the case with a sample and hold circuit of the type described in French Patent Application No 1361560.

In other words, only two types of leaks are considered in FIG. 8, namely the leakage current $I_{jct}$ and the gate leakage current $I_{GAT}$.

Figure 9:
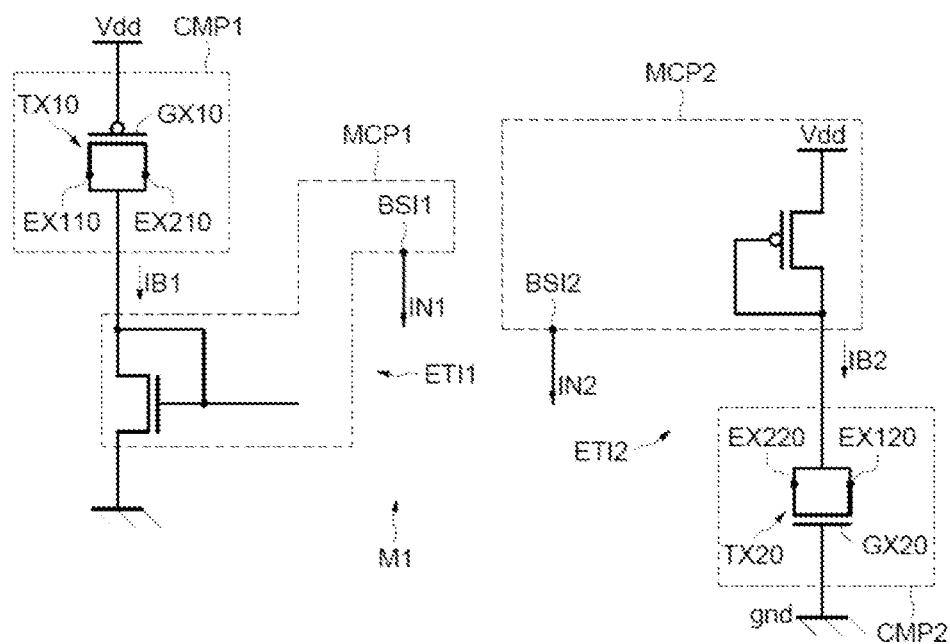

In this case, as illustrated in FIG. 9, the component used in the initial stages is at least one MOS transistor preferably having its two conduction electrodes, drain and source, connected together to the output of the corresponding initial stage, and having its gate connected to the supply terminal (Vdd or gnd).

More precisely, the component CMP1 comprises at least one auxiliary PMOS transistor TX10, the gate GX10 of which is connected to the supply voltage Vdd, and its two conduction electrodes EX110 and EX310 of which are connected together.

By analogy, the component CMP2 comprises at least one auxiliary NMOS transistor TX20, of which the gate GX20 is connected to earth gnd and the two conduction electrodes EX120 and EX220 of which are connected together.

As a variant, it would also be possible for only one of the conduction electrodes of the transistor TX10 and/or TX20 to be connected to the output of the corresponding initial stage, the other conduction electrode then being left floating.

Figure 10:
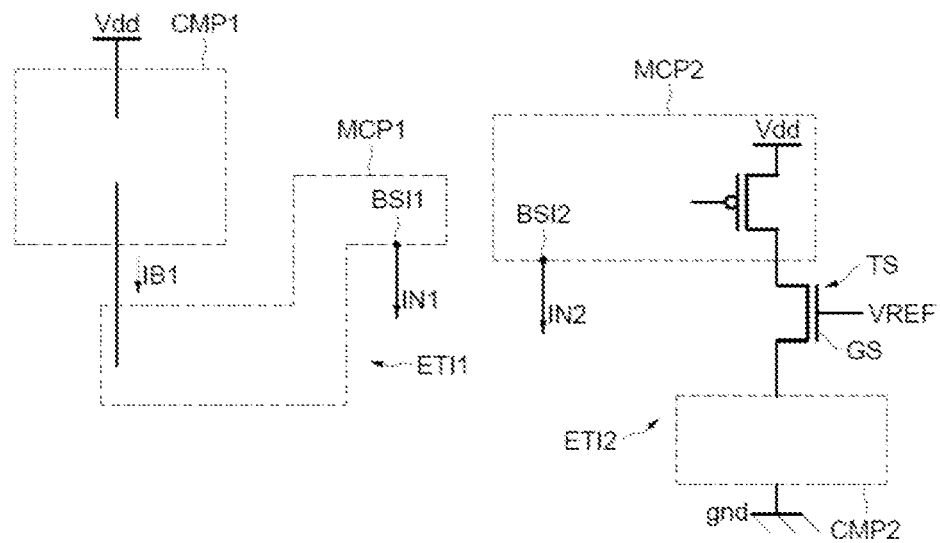

As illustrated in FIG. 10, in the case of a stable reference voltage regardless of the supply voltage Vdd, it is advantageous for the initial stage ETI2 associated with the NMOS transistor T2 two furthermore comprise at least one additional NMOS transistor TS, the gate of which is connected to a fixed reference voltage, for example the reference voltage VREF available across the terminals of the storage capacitor C, this additional NMOS transistor TS being connected in series with the component CMP2.

Such an embodiment makes it possible to have one or more NMOS leakage currents which are stable with respect to the supply voltage Vdd.

Figure 11:
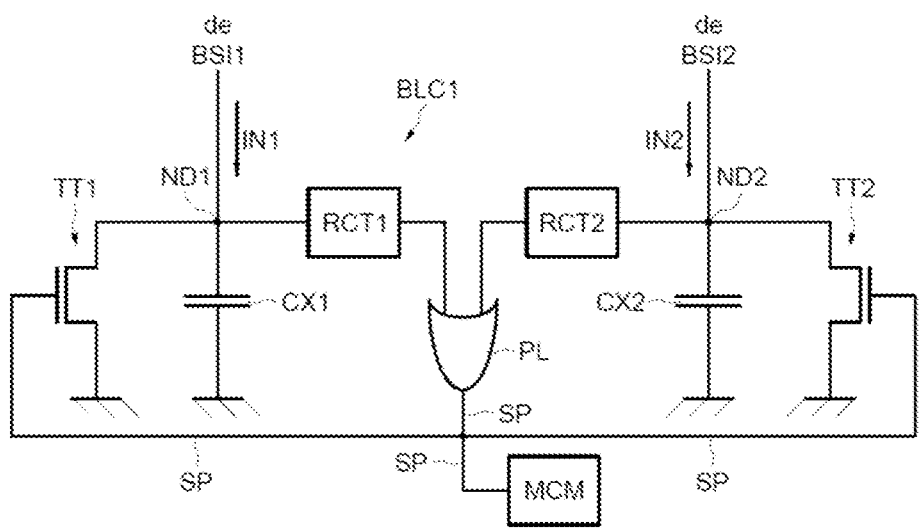

Reference will now be made more particularly to FIG. 11, in order to describe an embodiment of the second circuit M2 of the external circuit CXT.

In this embodiment, the external circuit CXT comprises a first auxiliary capacitor CX1 and a second auxiliary capacitor CX2.

The output terminal BSI1 of the first initial stage ETI1 is connected to the terminal ND1 of the first auxiliary capacitor CX1, whereas the output terminal BSI2 of the initial stage ETI2 is connected to the terminal ND2 of the second auxiliary capacitor CX2.

For this reason, the first initial stage ETI1 delivers the initial current IN1 to the first auxiliary capacitor CX1 so as to charge it.

Likewise, the second initial stage ETI2 delivers the second initial current IN2 to the second auxiliary capacitor CX2 so as to charge it.

It is therefore seen that, in this embodiment, the two initial currents IN1 and IN2 thus form two main currents delivered by the first circuit M1.

The first block BLC1 of the second circuit M2 is connected to the first and second auxiliary capacitors CX1 and CX2 and is configured in order to generate here a leading edge of a pulse IMP of the pulse signal when a threshold is reached by the first of the two voltages, respectively across the terminals of the two auxiliary capacitors.

Furthermore, the second block BLC2, which is connected to the output of the first block BLC1, is configured in order to discharge the two auxiliary capacitors in the presence of this pulse leading edge, the first block then generating the pulse trailing edge in response to this discharge.

More precisely, the first block BLC1 comprises a first rectifier stage RCT1, which is connected to the terminal ND1 of the first auxiliary capacitor CX1 and is configured in order to generate the leading edge of a pulse when the voltage $V_{ND1}$ across the terminals of the first auxiliary capacitor reaches a threshold.

The first block BLC1 furthermore comprises a second rectifier stage RCT2, which is connected to the terminal ND2 of the second auxiliary capacitor CX2 and is also configured in order to generate the leading edge of a pulse when the voltage across the terminals of the second auxiliary capacitor CX2 reaches a threshold, in the case in point the same threshold.

This being the case, the P-type leaks and the N-type leaks are generally not identical. Furthermore, depending on the case, the P-type leaks may be greater than the N-type leaks, or vice versa.

Consequently, depending on the case, the threshold of the rectifier stage will be reached first either by the voltage $V_{ND1}$ or by the voltage $V_{ND2}$.

In addition, a logic circuit is provided, in the case in point an OR logic gate referenced PL, which is configured in order to deliver a pulse at its output as soon as a pulse appears on one of its inputs.

The output of the logic gate PL is connected on the one hand to the control circuit MCM so as to deliver the pulse signal SP and, on the other hand, to the input of the second block BLC2, which is configured in order to discharge the two auxiliary capacitors CX1 and CX2 when each pulse leading edge occurs.

More precisely, the block BLC2 comprises a first additional transistor TT1, here an NMOS transistor, the gate of which is connected to the output of the logic gate PL and the drain of which is connected to the node ND1. The source of the transistor TT1 is connected to earth.

Likewise, the block BLC2 comprises a second additional transistor TT2, the gate of which is also connected to the output of the logic gate PL, the drain of which is connected to the node ND2, and the source of which is connected to earth.

Thus, when the leading edge of a pulse occurs, this turns the transistors TT1 and TT2 on, which earths the nodes ND1 and ND2 and consequently discharges the auxiliary capacitors CX1 and CX2.

Figure 12:
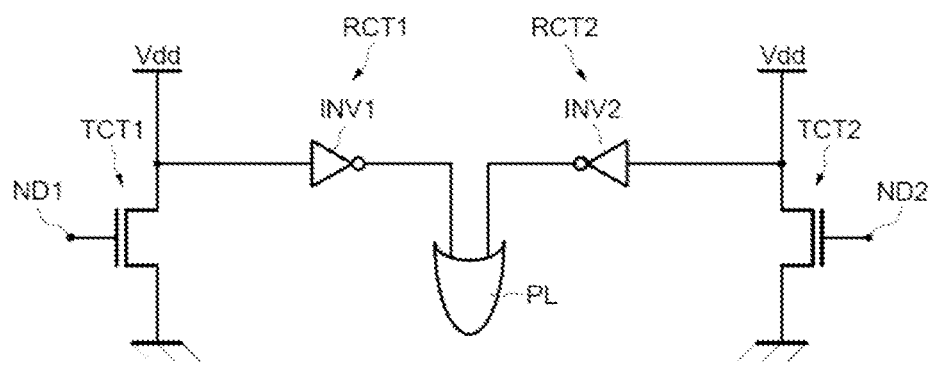

An exemplary embodiment of rectifier stages RCT1 and RCT2 is illustrated in FIG. 12.

Thus, the rectifier stage RCT1 (RCT2) here comprises an NMOS transistor TCT1 (TCT2), the source of which is connected to earth and the gate of which is connected to the corresponding node ND1 (ND2). The drain of the transistor TCT1 (TCT2) is connected to the supply voltage Vdd.

Each rectifier stage RCT1 (RCT2) furthermore comprises an inverter INV1 (INV2), which is connected between the drain of the corresponding transistor TCT1 (TCT2) and an input of the logic gate PL.

When the voltage at the nodes ND1, ND2 reaches the switching threshold of the transistors TCT1, TCT2 (appearance of the pulse leading edge), the transistors TCT1 and TCT2 are turned on, creating a high logic level (pulse leading edge) at the inputs of the gate PL, and making it possible to initiate discharge of the auxiliary capacitors.

When the voltage at the nodes ND1, ND2 becomes zero (discharge of the auxiliary capacitors), the transistors TCT1 and TCT2 are turned off, creating a low logic level (pulse trailing edge) at the inputs of the gate PL.

Figure 13:
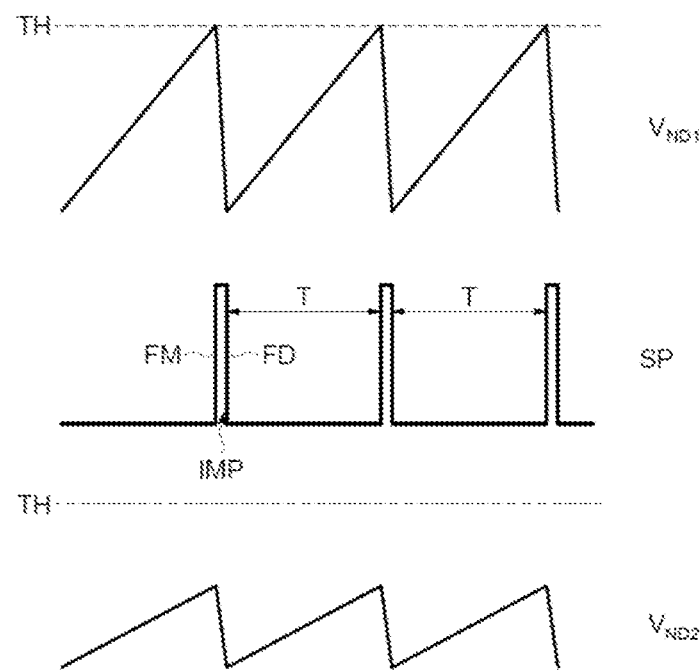

Reference will now be made more particularly to FIG. 13 in order to describe an example of the behavior of the circuit M2 illustrated in FIG. 11.

It is assumed in this figure that the P-type leaks are greater than the N-type leaks.

Consequently, as illustrated in the upper part of FIG. 13, the voltage $V_{ND1}$ across the terminals of the auxiliary capacitor CX1 increases more rapidly than the voltage $V_{ND2}$. This voltage increases in the shape of a ramp as the auxiliary capacitor CX1 is being charged. Then, when this voltage reaches the switching threshold TH, which is here the threshold voltage of the transistor TCT1, the latter is turned on. Consequently, a logical "1" is delivered at the input of the logic gate PL, which generates the leading edge FM of the pulse IMP of the signal SP (middle part of FIG. 13).

This leading edge then triggers the discharge of the auxiliary capacitors CX1 and CX2, turning the transistors TCT1 and TCT2 off again, which generates a logical "0" at the two inputs of the logic gate PL, and consequently the trailing edge FD of the pulse IMP.

Furthermore, as illustrated in the lower part of FIG. 13, the voltage $V_{ND2}$ never reaches the threshold TH.

In this case, consequently, the period T of the pulse signal SP is defined by the greatest leaks, in the case in point the P-type leaks.

In this embodiment, it has been assumed that the discharge of the auxiliary capacitors was very rapid. In practice, a delay line, for example a plurality of pairs of inverters, is preferably connected between the output of the logic gate PL and the transistors TT1 and TT2, so as to ensure a sufficient duration of the transistors TT1 and TT2 in the on state in order to fully discharge the auxiliary capacitors.

The period T of the pulse signal SP is proportional to the variation in voltage across the terminals of the storage capacitor. So as to adjust the value of this period in order to limit the variation to a desired maximum value across the terminals of the storage capacitor, various parameters may be adjusted, for example the sizes of the components CMP1, CMP2 (number, surface area and perimeter of the junctions, for example), the multiplicative coefficients of the current mirror, the size and therefore the capacitance of the auxiliary capacitors.

In the embodiments which have just been described, the initial currents delivered by the initial stages directly formed the main currents delivered to the auxiliary capacitors so as to charge them.

Figure 14:
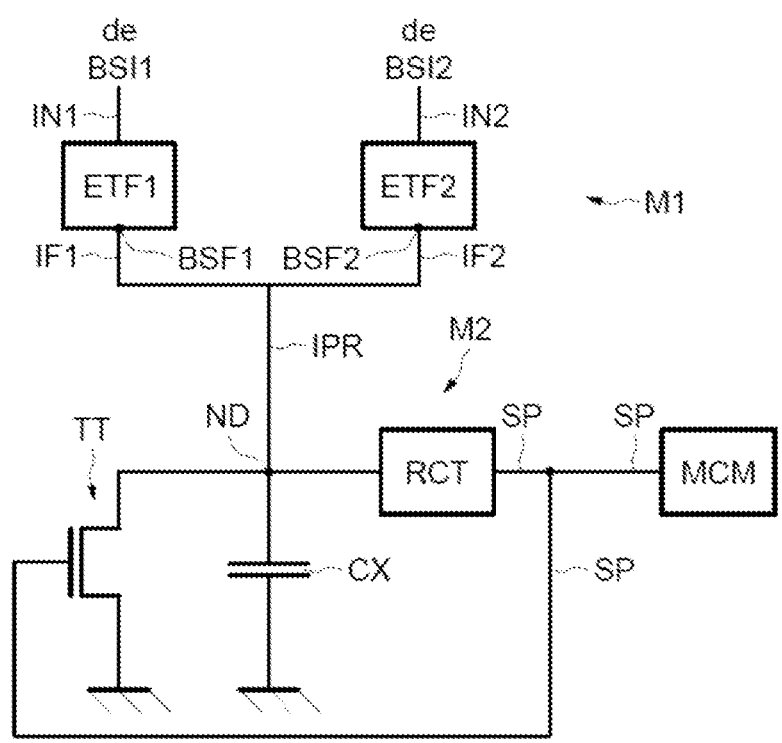

In the embodiments illustrated in FIGS. 14 to 16, which will now be described, the first circuit M1 furthermore comprises, downstream of the initial stages, final stages ETF1, ETF2 (FIG. 14) respectively delivering two final currents IF1, IF2 on the basis of the initial currents IN1, IN2 delivered at the outputs BSI1 and BSI2 of the initial stages.

These two final currents are then summed in order to form a single main current IPR, which is delivered to the terminal ND of a single auxiliary capacitor CX so as to charge it.

The second circuit M2 then comprises a single rectifier stage RCT, which is connected to the node ND in order to deliver the pulse signal SP resulting from the charging and discharging of the auxiliary capacitor CX, this discharge being obtained upon occurrence of the leading edge of each pulse of the signal SP using the transistor TT, as described above.

The first final stage ETF1 is configured in order to generate the first final current IF1, which is equal
to the difference between the first initial current IN1 and the second initial current IN2 if this difference is positive, or
to 0 if this difference is negative (because the current IF1 cannot be negative).

By analogy, the second final stage ETF2 is configured in order to generate the second final current IF2, which is equal
to the difference between the second initial current IN2 and the first initial current IN1 if this difference is positive, or
to 0 if this difference is negative.

Figure 15:
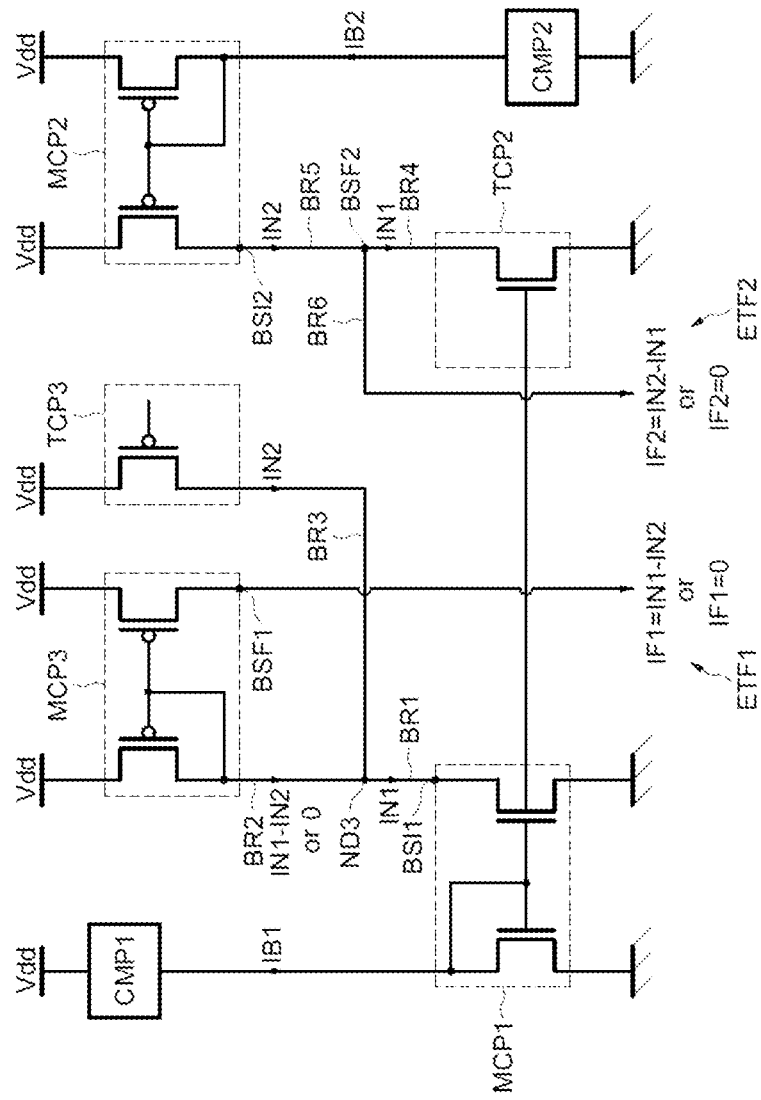

This is obtained, for example, with the aid of current mirror and specific interconnections, as illustrated in FIG. 15.

More precisely, the first final stage ETF1 comprises current mirror MCP3, which are connected between the current mirror MCP1 delivering the first initial current IN1 and the output terminal BSF1, as well as a PMOS transistor TCP3 which, with one of the transistors of the current mirror MCP2, forms current mirror also delivering the second initial current IN2.

The drain of the transistor TCP3 is connected to a node ND3 between the current mirror MCP1 and the current mirror MCP3.

Thus, the branch BR1 delivers the first initial current IN1 while the branch BR3 delivers the second initial current IN2. Consequently, if the difference IN1−IN2 is positive, then the current IN1−IN2 flows in the branch BR2. In the converse case, no current flows in the branch BR2.

Furthermore, by virtue of the current mirror MCP3 having a mirror coefficient equal to 1, the terminal BSF1 of the final stage ETF1 delivers the first final current IF1, which is equal either to IN1−IN2 or to 0.

The second final stage ETF2 comprises an NMOS transistor TCP2 forming, with one of the transistors of the current mirror MCP1, new current mirror having a multiplicative coefficient equal to 1 so as also to deliver the first initial current IN1.

The output terminal BSF2 of the second final stage ETF2 lies between the terminal BSI2 and the drain of the transistor TCP2.

The current flowing in the branch BR4 is the first initial current IN1, whereas the current flowing in the branch BR5 is the second initial current IN2.

Consequently, if the difference IN2−IN1 is positive, then the current IN2 flowing in the branch BR6 connected to the terminal BSF2 is equal to this difference IN2−IN1.

If, conversely, the current IN2 is less than the current IN1, then the current IF2 is zero since there cannot be a negative current.

Consequently, the single auxiliary capacitor CX is charged either with the main current equal to the difference IN1−IN2 if IN1 is greater than IN2, or alternatively with the main current equal to the difference IN2−IN1 if IN2 is greater than IN1.

For this reason, the period of the pulse signal will here again be determined while taking into account those of the P-type leaks or N-type leaks which are the greater.

It is possible for the currents IN1 and IN2 to be equal or very similar. Their difference may be close to 0 when these currents are not negligible.

In order to avoid having almost zero current differences IN1−IN2, depending on the case, it is preferable for the first final current IF1 to be equal
to the difference between the first initial current IN1 and the product of the second initial current IN2 multiplied by a coefficient α less than 1, if this difference is positive, or
to 0 if this difference is negative.

Likewise, it is preferable for the second final current IF2 to be equal
to the difference between the second initial current IN2 and the product of the first initial current IN1 multiplied by the coefficient α, if this difference is positive, or
to 0 if this difference is negative.

This coefficient α is, for example, between 0.5 and 1.

Figure 16:
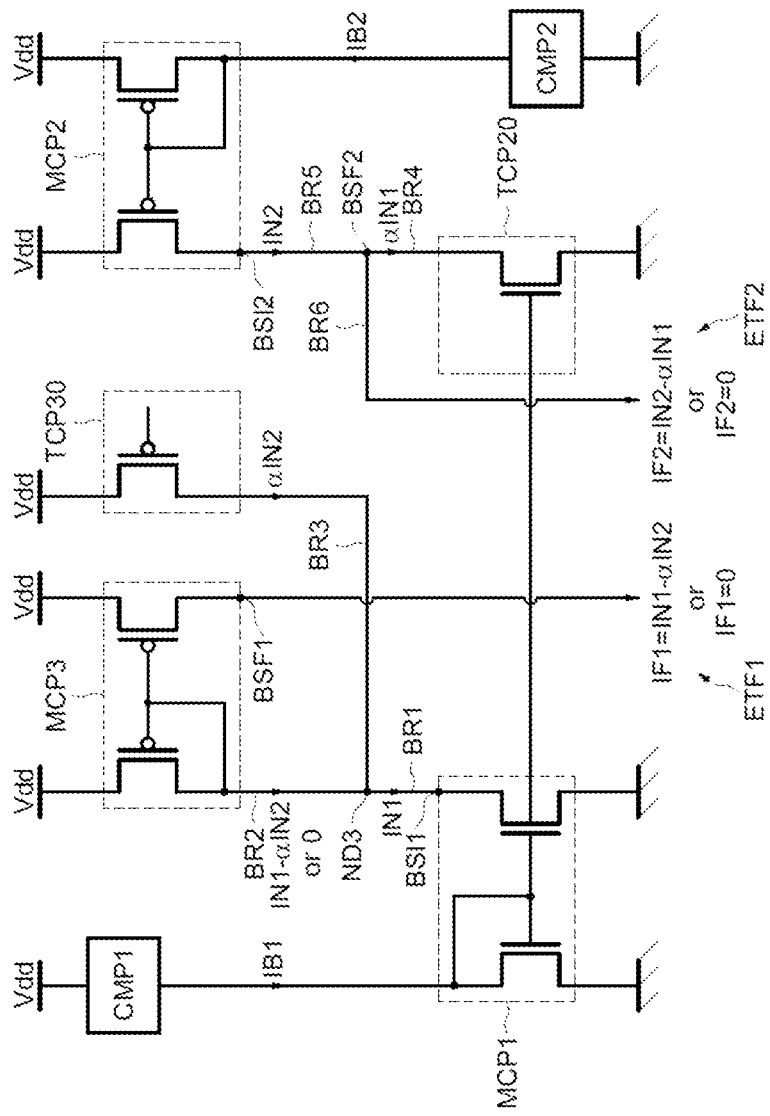

Physically, the structure of the final stages ETF1 and ETF2 making it possible to obtain this weighted difference is, as illustrated in FIG. 16, similar to the structure illustrated in FIG. 15, except for the difference that this time the transistor TCP30 delivering the current α IN2 forms, with one of the transistors of the current mirror MCP2, current mirror having a multiplicative coefficient equal to α, and that, by analogy, the transistor TCP20 delivering the current α IN1 forms, with one of the transistors of the current mirror MCP1, current mirror with a multiplicative coefficient α.

In summary, according to one aspect of the invention, the period of the pulse signal is advantageously:
exponentially proportional to the temperature (in the same way as the strength of the leaks),
proportional to the variation in voltage across the terminals of the storage capacitor,
proportional to the leaks of N-type junctions (NMOS transistor) when they are greater than the leaks of P-type junctions (PMOS transistor), and proportional to the leaks of P-type junctions when they are greater than the leaks of N-type junctions,
not proportional to the supply voltage (Vdd) when the voltage reference across the terminals of the storage capacitor leaks to earth (gnd) in the case of a stable reference voltage regardless of the supply voltage Vdd and in the case in which the NMOS transistor TS having a fixed voltage on its gate has been integrated,
proportional to the supply voltage (Vdd) when the voltage reference across the terminals of the storage capacitor leaks to this supply voltage (Vdd).

Figure 17:
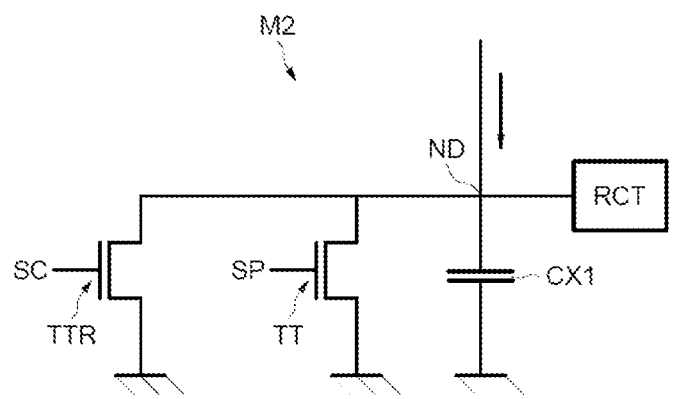
Figure 18:
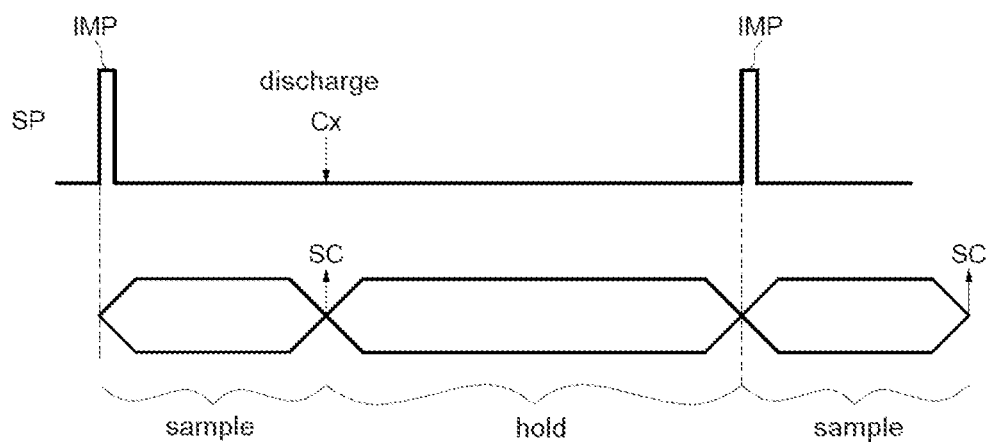

Whereas, in the embodiments which have just been described, the auxiliary capacitor or capacitors were discharged only when each pulse IMP of the pulse signal SP occurred, it is possible as illustrated in FIGS. 17 to 18 to carry out an additional discharge of the auxiliary capacitor or capacitors CX at the end of each sampling phase.

This is achieved by emitting a control logic signal SC which controls the gate of an NMOS transistor TTR connected in parallel with the transistor TT controlled by the pulse signal SP. Furthermore, when the control signal SC is emitted in the state 1, at the end of the sampling phase, the transistor TTR is turned on, which discharges the auxiliary capacitor or capacitors CX.

Furthermore, whereas in the embodiments which have been described the pulse signal SP which is delivered to the control circuit MCM is obtained directly from the charges and discharges of the auxiliary capacitor or capacitors, as a variant it is possible to generate an initial pulse signal directly from the charges and discharges of the auxiliary capacitor or capacitors and to carry out frequency division of the initial pulse signal in a conventional frequency divider, for example located just upstream of or in the control circuit MCM, so as to generate the pulse signal which will be used for controlling the sample and hold circuit.

Furthermore, the value of the frequency divider may then be an additional parameter for adjustment of the separation between the pulses of the pulse signal, so as to obtain a desired maximum limit of the variation in voltage across the terminals of the storage capacitor.

The invention is not limited to the embodiments which have just been described. In fact, what has just been described is valid regardless of the structure of the switching module of the sample and hold circuit SH. In particular, if the switching module comprises only a single MOS transistor, whether this transistor is an NMOS transistor or a PMOS transistor, the external circuit CXT will be adapted accordingly and will comprise, for example, only one or several components CMP uniquely representative of at least one leakage current of the NMOS or PMOS transistor of the switching module.

Furthermore, it is of course possible for the integrated circuit to comprise a plurality of sample and hold circuits, and a plurality of external circuits respectively associated with these various sample and hold circuits.

Whereas an application of the invention to the control of a sample and hold circuit has just been described by way of example, other applications of the invention are possible, for example the characterization of leaks of a method of fabricating MOS transistors.

Figure 19:
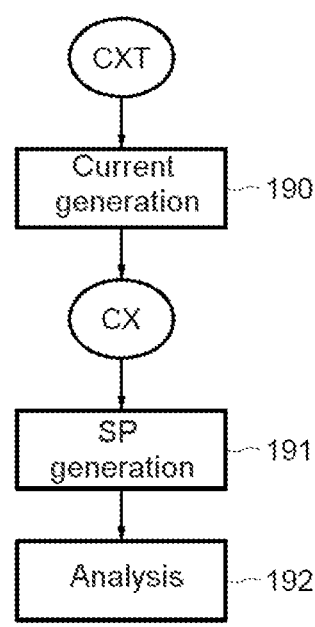

This is schematically represented in FIG. 19.

Thus, using a circuit CXT external to the MOS transistors, with a structure similar to that which has been described above, at least one current representative of at least one leakage current of at least one MOS transistor in the off state is generated (step 190).

This current is delivered to at least one auxiliary capacitor CX and a pulse signal is generated (step 191) from the charging and discharging of this auxiliary capacitor. As indicated above, the pulse signal comprises periodic pulses whose period is linked with the leaks of the MOS transistors.

Furthermore, this period is commensurately shorter when the leaks are greater.

Consequently, by carrying out an analysis (step 192) of this period, the strength of the leaks and/or the type of leak of the MOS transistors produced in this way can be determined.

This characterization is very reliable at any temperature and makes it possible to avoid direct measurements of these leaks by (nano)ammeters, which is very difficult at ambient temperature and almost impossible at very low temperature.

Of course, it is possible to generate all the various leakage currents which have been described above and to select them by external controls with the aid of PMOS or NMOS switches, in order to use only one for the generation of the pulse signal and to measure the corresponding frequency.

What is claimed is:

1. A method for controlling a sample and hold circuit that comprises a switching module connected to a storage capacitor, the method comprising:
   generating, by a circuit external to the sample and hold circuit, a main current related to a leakage current of the switching module in an off state of the switching module;
   delivering the main current to an auxiliary capacitor;
   generating an initial pulse signal from charging and discharging of the auxiliary capacitor; and
   triggering a sampling phase of the sample and hold circuit at a rate of pulses of a pulse signal derived from the initial pulse signal.

2. The method according to claim 1, further comprising adjusting a time separation between the pulses of the pulse signal so as to obtain a desired maximum limit of the variation in voltage across terminals of the storage capacitor.

3. The method according to claim 1, wherein the switching module comprises a MOS transistor, wherein generating the main current comprises generating an initial current representative of a leakage current of the MOS transistor in an off state of the MOS transistor, the main current being obtained from the initial current.

4. The method according to claim 1, wherein the switching module comprises an NMOS transistor and a PMOS transistor that are coupled to the storage capacitor;
   wherein generating the main current comprises generating, by the external circuit, a first initial current that represents a leakage current of the PMOS transistor, the first initial current forming a first main current and generating a second initial current that represents a leakage current of the NMOS transistor, the second initial current forming a second main current;
   wherein delivering the main current to the auxiliary capacitor comprises delivering the first main current to a first auxiliary capacitor and delivering the second main current to a second auxiliary capacitor; and
   wherein generating the initial pulse signal comprises charging the first auxiliary capacitor and charging of the second auxiliary capacitor until a threshold voltage is reached by one of the first or second auxiliary capacitors, wherein a first edge of a pulse of the initial pulse signal is generated upon reaching the threshold, the first edge triggering discharge of the first auxiliary capacitor and of the second auxiliary capacitor, the discharge causing a second edge of the pulse in a direction opposite to that of the first edge to be generated.

5. The method according to claim 1, wherein the switching module comprises an NMOS transistor and a PMOS transistor that are coupled to the storage capacitor;
   wherein generating the main current comprises generating a first initial current representative of a leakage current of the PMOS transistor, generating a second initial current representative of a leakage current of the NMOS transistor, generating a first final current that is equal to a difference between the first initial current and the second initial current when this difference is positive and equal to zero when the difference is negative, generating a second final current that is equal to a difference between the second initial current of the first initial current when the difference is positive or equal to zero when the difference is negative, and summing the first and second final currents so as to generate a single main current;

wherein delivering the main current to the auxiliary capacitor comprises delivering the single main current to a single auxiliary capacitor; and wherein generating the initial pulse comprises charging the single auxiliary capacitor until a voltage across terminals of the single auxiliary capacitor reaches a threshold, wherein a first edge of a pulse of the initial pulse signal is generated upon reaching the threshold generating, the first edge triggering a discharge of the single auxiliary capacitor, the discharge causing a second edge of the pulse in a direction opposite to that of the first edge to be generated.

6. The method according to claim 1, wherein the switching module comprises an NMOS transistor and a PMOS transistor that are connected to the storage capacitor;

wherein generating the main current comprises generating, by the external circuit, a first initial current representative of a leakage current of the PMOS transistor, generating a second initial current representative of a leakage current of the NMOS transistor, generating a first final current that is equal to a difference between the first initial current and a product of the second initial current multiplied by a coefficient α when the difference is positive and to zero when the difference is negative, generating a second final current that is equal to a difference between the second initial current and the product of the first initial current multiplied by the coefficient when the difference is positive or to zero when the difference is negative, and summing the first and second final currents to generate a single nonzero main current, wherein the coefficient α is than one;

wherein delivering the main current to the auxiliary capacitor comprises delivering the single main current to a single auxiliary capacitor; and wherein generating the initial pulse signal comprises charging of the single auxiliary capacitor until a voltage across terminals of the single auxiliary capacitor reaches a threshold, wherein a first edge of a pulse of the initial pulse signal is generated upon reaching of the threshold, the first edge triggering a discharge of the single auxiliary capacitor, the discharge causing a second edge of the pulse in a direction opposite to that of the first edge to be generated.

7. The method according to claim 3, wherein the MOS transistor is an NMOS transistor and where in generating the main current further comprises generating a corresponding initial current through an additional NMOS transistor of the external circuit, the additional NMOS transistor having a gate that is connected to the storage capacitor.

8. The method according to claim 1, wherein generating the initial pulse signal comprises charging the auxiliary capacitor until a voltage across terminals of the auxiliary capacitor reaches a threshold, wherein a first edge of a pulse of the initial pulse signal is generated upon reaching the threshold and wherein the first edge triggers discharge of the auxiliary capacitor, the discharge causing generation of a second edge of the pulse in a direction opposite to that of the first edge.

9. The method according to claim 1, further comprising discharging the auxiliary capacitor at the end of the sampling phase.

10. A method for characterization of a method of fabricating MOS transistors, the method for characterization comprising:

generating, by a circuit external to the MOS transistors, a current related to a leakage current of a MOS transistor of the MOS transistors in the off state;

delivering the generated current to an auxiliary capacitor;

generating a pulse signal by charging and discharging the auxiliary capacitor; and analyzing a separation between pulses of the pulse signal, wherein the separation is commensurately less when the leaks are greater.

11. A control device for a sample and hold circuit that comprises a switching module coupled to a storage capacitor, the device comprising:

an auxiliary capacitor;

a first circuit configured to generate a main current that is related to a leakage current of the switching module in an off state of the switching module and to deliver the main current to the auxiliary capacitor;

a second circuit configured to generate an initial pulse signal from charging and discharging of the auxiliary capacitor; and a control circuit configured to trigger a sampling phase of the sample and hold circuit at a rate of pulses of a pulse signal derived from the initial pulse signal.

12. The device according to claim 11, wherein a time separation between the pulses of the pulse signal is adjusted so as to obtain a desired maximum limit of the variation in voltage across terminals of the storage capacitor.

13. The device according to claim 11, wherein the switching module comprises a MOS transistor, wherein the first circuit comprises an initial stage that is associated with the MOS transistor and is configured to generate an initial current representative of a leakage current of the MOS transistor in an off state of the MOS transistor, the main current being obtained from the initial current.

14. The device according to claim 11, wherein the switching module comprises an NMOS transistor and a PMOS transistor that are coupled to the storage capacitor;

wherein the device comprises a first auxiliary capacitor and a second auxiliary capacitor;

wherein the first circuit comprises a first initial stage that is associated with the PMOS transistor and is configured to generate a first initial current representative of a leakage current of the PMOS transistor, the first initial current forming a first main current, and to deliver the first main current to the first auxiliary capacitor;

wherein the first circuit further comprises a second initial stage that is associated with the NMOS transistor and is configured to generate a second initial current representative of a leakage current of the NMOS transistor, the second initial current forming a second main current, and to deliver the second main current to the second auxiliary capacitor;

wherein the second circuit comprises a first block that is coupled to the first and second auxiliary capacitors and is configured in order to generate a first edge of a pulse of the initial pulse signal when a threshold is reached by one of the two voltages respectively across terminals of the first and second auxiliary capacitors; and wherein a second block is coupled to an output of the first block and is configured to discharge the first and second auxiliary capacitors in response to the first edge of the pulse, the first block being configured to generate a second edge of the pulse in a direction opposite to that of the first edge in response to the discharge.

15. The device according to claim 11, wherein the switching module comprises an NMOS transistor and a PMOS transistor that are coupled to the storage capacitor and wherein the device comprises a single auxiliary capacitor;
wherein the first circuit comprises:
a first initial stage that is associated with the PMOS transistor and is configured to generate a first initial current representative of a leakage current of the PMOS transistor;
a second initial stage that is associated with the NMOS transistor and is configured in order to generate a second initial current representative of a leakage current of the NMOS transistor;
a first final stage configured to generate, at an output of the first final stage, a first final current that is equal to a difference between the first initial current and the second initial current when the difference is positive and to zero when the difference is negative; and
a second final stage configured to generate, at an output of the second final stage, a second final current that is equal to a difference between the second initial current and the first initial current when the difference is positive and to zero when the difference is negative;
wherein the outputs of the first and second final stages are coupled together to a terminal of the single auxiliary capacitor, so as to allow the single auxiliary capacitor to be charged with a main current that is equal to a sum of the first and second final currents; and
wherein the second circuit comprises a first block that is coupled to the single auxiliary capacitor and is configured in order to generate a first edge of a pulse of the initial pulse signal when a voltage across terminals of the single auxiliary capacitor reaches a threshold, and a second block that is coupled to the output of the first block and is configured to discharge the single auxiliary capacitor in response to the first edge of the pulse, the first block being configured to generate a second edge of the pulse in a direction opposite to that of the first edge in response to the discharge.

16. The device according to claim 11, wherein the switching module comprises an NMOS transistor and a PMOS transistor that are coupled to the storage capacitor, the device comprising a single auxiliary capacitor;
wherein the first circuit comprises:
a first initial stage associated with the PMOS transistor and configured to generate a first initial current representative of a leakage current of the PMOS transistor;
a second initial stage associated with the NMOS transistor and configured to generate a second initial current representative of a leakage current of the NMOS transistor,
a first final stage configured to generate, at an output of the first final stage, a first final current that is equal to a difference between the first initial current and a product of the second initial current multiplied by a coefficient that is less than one when this difference is positive, and to zero when the difference is negative; and
a second final stage configured to generate, at an output of the second final stage, a second final current that is equal to a difference between the second initial current and a product of the first initial current multiplied by the coefficient when this difference is positive, and to zero when the difference is negative;

wherein the outputs of the first and second final stages are coupled together to a terminal of the single auxiliary capacitor, so as to allow the single auxiliary capacitor to be charged with a main current that is equal to the nonzero sum of the first and second final currents; and
wherein the second circuit comprises a first block that is coupled to the single auxiliary capacitor and is configured to generate a first edge of a pulse of the initial pulse signal when a voltage across the terminals of the single auxiliary capacitor reaches a threshold, and a second block that is coupled to the output of the first block and is configured in order to discharge the single auxiliary capacitor in response to the first edge of the pulse, the first block being configured to generate a second edge of the pulse in a direction opposite to that of the first edge in response to the discharge.

17. The device according to claim 13, wherein the initial stage associated with the MOS transistor comprises a component connected in series between a supply terminal and an output of the initial stage, the supply terminal being intended to receive a supply voltage identical to a gate voltage of the MOS transistor in off state of the MOS transistor, the component being configured to deliver a base current representative of a leakage type of the MOS transistor, the corresponding initial current being obtained from the base current.

18. The device according to claim 17, wherein the initial stage comprises a current mirror with a mirror coefficient greater than 1, the current mirror being connected between the component and the output of the initial stage and configured in order to deliver the corresponding initial current.

19. The device according to claim 17, wherein the component comprises a reverse-biased PN junction.

20. The device according to claim 17, wherein the component comprises an auxiliary MOS transistor of the same channel type as the MOS transistor of the switching module, the auxiliary MOS transistor having a conduction electrode coupled to an output of a corresponding initial stage and having a gate coupled to the supply terminal.

21. The device according to claim 17, wherein the component comprises an auxiliary MOS transistor of the same channel type as the MOS transistor of the switching module, the auxiliary MOS transistor having a first conduction electrode coupled to the supply terminal, and a second conduction electrode coupled to an output of a corresponding initial stage, and being configured to be in an off state.

22. The device according to claim 17, wherein the initial stage associated with the MOS transistor further comprises an additional MOS transistor, a gate of the additional MOS transistor being coupled to the storage capacitor, the additional MOS transistor being coupled in series with the component.

23. The device according to claim 11, wherein the second circuit comprises a first block that is coupled to the auxiliary capacitor and is configured to generate a first edge of a pulse of the initial pulse signal when a voltage across terminals of the auxiliary capacitor reaches a threshold, and a second block that is coupled to an output of the first block and is configured to discharge the auxiliary capacitor in response to the first edge of the pulse, the first block being configured to generate a second edge of the pulse in a direction opposite to that of the first edge in response to the discharge.

24. The device according to claim 11, wherein the auxiliary capacitor is of the same type as the storage capacitor.

25. The device according to claim 11, wherein the second circuit is also configured to carry out an additional discharge of the auxiliary capacitor at an end of the sampling phase.

26. The method according to claim 1, wherein the sample and hold circuit comprises a MOS transistor and wherein the leakage current comprises a gate leakage current or a junction leakage current of the MOS transistor.

27. The method according to claim 10, wherein the generated current is related to a junction leakage current of the MOS transistor of the MOS transistors in the off state.

28. The method according to claim 10, wherein the generated current is related to a gate leakage current of the MOS transistors in the off state.

\* \* \* \* \*